United States Patent
Klemt et al.

(10) Patent No.: US 6,777,827 B1
(45) Date of Patent: Aug. 17, 2004

(54) SWITCHING ARRANGEMENT FOR GALVANICALLY INSULATED CONTROL OF A LOAD-CONTROLLED POWER SWITCH

(76) Inventors: Michael Klemt, Lofflerstr. 6c, D-80999 München (DE); Karlheinz Klemt, Am Auger 9, D-84175 Eching (DE)

( * ) Notice: Subject to any disclaimer, the term of this patent is extended or adjusted under 35 U.S.C. 154(b) by 0 days.

(21) Appl. No.: 09/913,364
(22) PCT Filed: Feb. 7, 2000
(86) PCT No.: PCT/DE00/00368
§ 371 (c)(1),
(2), (4) Date: Aug. 10, 2001
(87) PCT Pub. No.: WO00/48317
PCT Pub. Date: Aug. 17, 2000

(30) Foreign Application Priority Data

Feb. 10, 1999 (DE) .......................... 199 05 500
Dec. 27, 1999 (DE) .......................... 199 63 330

(51) Int. Cl.[7] .......................... H01H 47/00; H01B 1/00
(52) U.S. Cl. .................. 307/125; 307/136; 327/108
(58) Field of Search .................. 307/125, 139; 327/108, 109, 110

(56) References Cited

U.S. PATENT DOCUMENTS 5,051,609 A  9/1991  Smith
5,304,863 A  4/1994  Cargille

FOREIGN PATENT DOCUMENTS

FR  WO 93/11609  6/1993
JP  62-254518    6/1987

*Primary Examiner*—Gregory J. Toatley, Jr.
(74) *Attorney, Agent, or Firm*—R W Becker & Associates; R W Becker

(57) ABSTRACT

In a switching arrangement for controlling a load-controlled power switch via a transformer Ü, a voltage signal is inputted into the transformer, the voltage signal being comprised of impulses of short duration T1p, T1n in positive and negative directions. Two field effect transistors F1, F2 at the secondary side of the transformer Ü convert the impulses T1p, T1n into impulses T3p, T3n in positive and negative directions which reliably control the power switch LT, the impulse duration of the impulses T3p, T3n being extended to the beginning of the next input impulses with reversed voltage directions T1n, T1p. A diode D1 and D2, respectively, is disposed in each of the field effect transistors F1 and F2 between the source terminal S and the drain terminal D thereof. A respective series switch is activated ahead of the gate terminals of each respective field effect transistor F1 and F2.

16 Claims, 2 Drawing Sheets

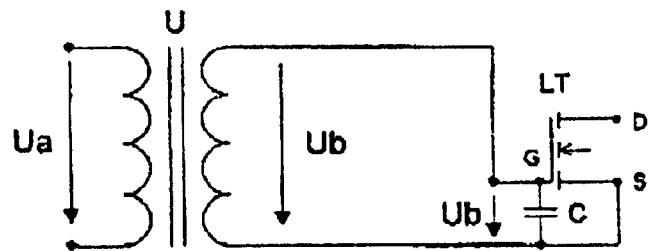
Fig. 1, corrsponds to the prior art
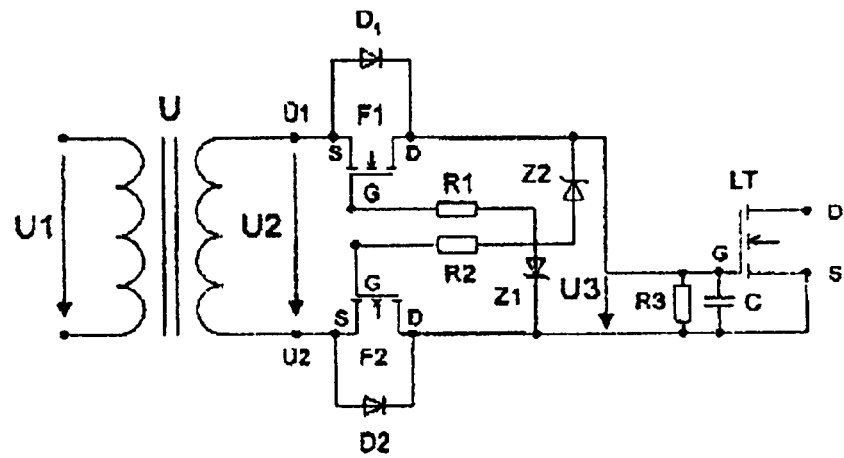
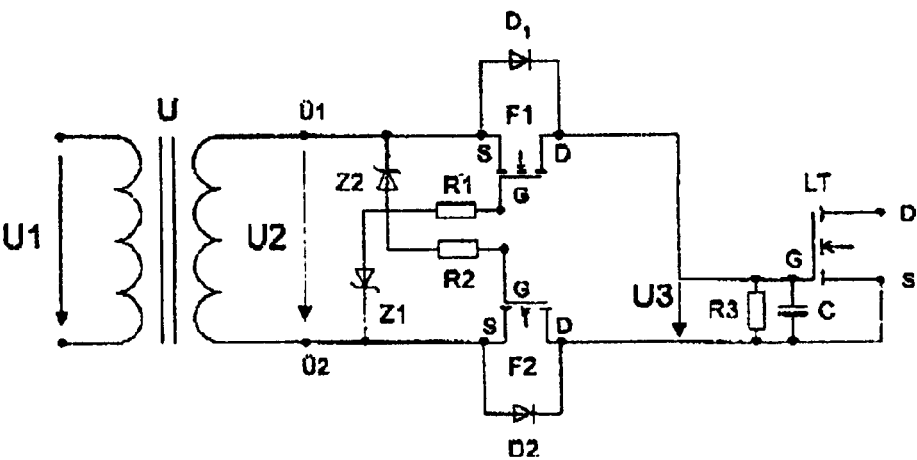

$U1p = (-U1n)$   $U3p = (-U3n)$ $T1p = T1n$

SWITCHING ARRANGEMENT FOR GALVANICALLY INSULATED CONTROL OF A LOAD-CONTROLLED POWER SWITCH

BACKGROUND OF THE INVENTION

The present invention relates to a switching arrangement for controlling a load-controlled power switch via a transformer with positive and negative voltage impulses.

In a switching arrangement of this type, the impulse is transferred from the primary side of the transformer to the secondary side thereof. This transfer can only be accomplished in an error free manner if the voltage time surfaces of the positive and negative voltage impulses are the same. A power switch requires, for its activation, a positive voltage impulse and, for its de-activation, a negative voltage impulse. In most cases, during periods of the same duration, the relationship between the length or duration of the positive and negative impulses (the duty cycle) changes so that the voltage time surfaces are not equal and the transformer, following a certain time, is saturated. This leads to the consequence that the voltage at the input of the transformer breaks through, or the amplitudes change, in the event that a capacitor is connected in series to an input on the primary side of the transformer. It has also not been heretofore possible to generate, with the help of a transformer, the voltages required for the activation and de-activation of a power switch such that these voltage impulses are generated in a consistently error-free manner and have the desired duty cycle.

JP 62-25418A discloses a gate driver circuit in which two field effect transistors are disposed on the secondary side of the transformer, the gate terminals of the field effect transistors being coupled directly to the discharge circuits of the transformer.

WO 9311609A1 discloses a switching arrangement in which two different impulse series having differing amplitudes are inputted into the input of the transformer, whereby only the positive impulses of the first impulse series and only the negative impulses of the second impulse series are rectified on the secondary side of the transformer.

SUMMARY OF THE INVENTION

The present invention offers a solution to the challenge of providing, in a transformer, short time impulses which do not lead to saturation of the transformer, and providing a preparation of the inputted impulses to the secondary side of the transformer such that the power switch is reliably activated and de-activated.

The important advantage of the invention is comprised in the fact that the inputting of only short time input impulses to the activated field effect transistors on the secondary side of the transformer produces the required longer impulses which ensure the reliable activation and de-activation of the power transistors. Only short impulses are therefore inputted into the transformer, which cannot lead to a saturation of the transformer. If an impulse in the positive direction is at the secondary side of the transformer, one of the two field effect transistors is activated and the free running diode of the other transistor is driven in a forward or pass direction so that the voltage at the secondary side of the transformer is disposed at the power transistor which is to be activated. In connection with an impulse in the negative direction, the transistors perform an opposite function so that the negative voltage is disposed at the power transistor to be activated. If no impulse is provided, the free running diode no longer runs in the forward or pass direction but, instead, is driven in the blocking direction, whereby the voltage at the gate of the power switch remains available as the charge carrier cannot drain.

BRIEF DESCRIPTION OF THE DRAWINGS

The present invention is described in further detail in connection with switching configurations shown in the figures of the drawings. The figures of the drawings are:

FIG. 1 shows a power switch connected with a transformer in accordance with the prior art.

FIG. 2 shows the switching arrangement of the present invention for controlling a power switch, whereby the gate terminals of the field effect transistors disposed on the secondary side of the transformer are connected via a series circuit comprising a resistor and a zener diode with the drain terminals of the respective other field effect transistors.

FIG. 3 shows a further embodiment of the switching arrangement of the present invention for controlling a power switch, whereby the gate terminals of the two field effect transistors on the secondary side of the transformer are connected via a series circuit comprising a resistor and a zener diode with the source terminals of the respective other field effect transistor.

DESCRIPTION OF PREFERRED EMBODIMENTS

As seen in FIG. 1, in a conventional switching arrangement, a signal Ua is transferred via a transformer Ü to a power switch LT. If the signal on the primary side of the transformer Ü is to be transferred in an error-free manner to the secondary side of the transformer, the voltage time surfaces of the positive and negative voltage impulses must be the same magnitude. In the event of unequal magnitudes of the voltage time surfaces, the transformer, after the passage of a certain time, will be saturated, which leads to the consequence that the voltage impulses no longer possess the desired plot or form.

As seen in FIG. 2, in one embodiment of the switching arrangement of the present invention, the field effect transistors F1 and F2 are activated in the discharge outlets Ü1 and Ü2 of the secondary portion of the transformer Ü. The field effect transistor F1 is disposed with its source terminal S and its drain terminal D connected via an intermediary circuit to an internal diode D1 directly in the discharge circuit Ü1. The gate terminal G of the field effect transistor F1 is connected via an intermediary circuit of a resistor R1 and a zener diode Z1 to the drain terminal D of the field effect transistor F2. The field effect transistor F2 is disposed in the same directional sense with its source terminal S and its drain terminal D via an intermediary circuit of an internal diode D2 in the discharge circuit Ü2. The gate terminal G of the second field effect transistor F2 is connected via an intermediary circuit comprising a resistor R2 and a zener diode Z2 to the drain terminal D of the field effect transistor F1. The gate terminal G of the power switch LT is connected with the drain terminal D of the field effect transistor F1, and the source terminal S of the power switch is connected to the drain terminal D of the second field effect transistor F2. An input capacitor C and a resistor R3 are connected in parallel between the gate terminal G and the source terminal S of the power transistor LT.

Figure 6:
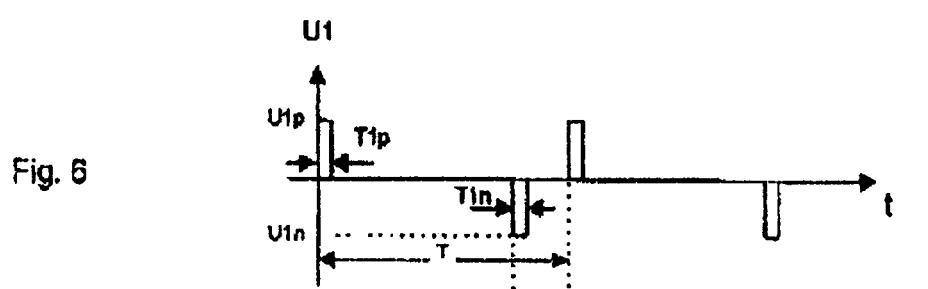
FIG. 6 shows in a diagram the arrangement of the voltage impulses inputted into the transformer as a function of time and FIG. 7 shows in a diagram as a function of time the voltage impulse which, following their preparation by the field effect transistors in the secondary region of the transformer, are at the power switch.
Figure 7:
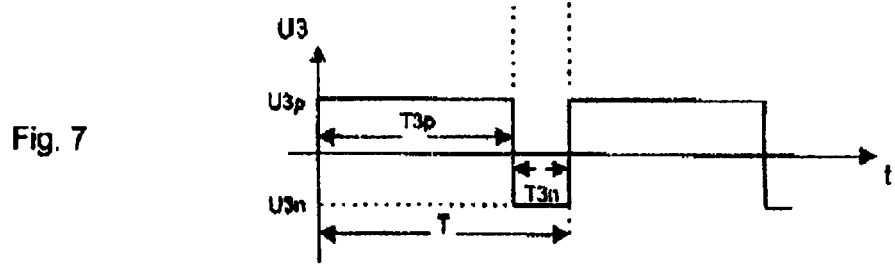

The function of the switching arrangement shown in FIG. 2 is as follows: in the input of the transformer Ü, a voltage signal U1 comprising positive impulses (amplitude U1p, duration T1p) and negative impulses (amplitude U1 and, duration T1) are inputted (see FIG. 6). In this connection, the duration of the period T of the voltage signal U1 corresponds to the length of the impulse that is prepared on the secondary side of the transformer Ü for controlling the power switch LT for the required period T (T3p, T3n, see FIG. 7). The impulses T1p and T1n have the same amplitude and duration, whereby these impulses are purposely configured to have a duration precisely as long as the switching operations of the power switch which is to be controlled, which thereby offers the advantage that, during this critical phase, the power switch sees a low resistance or low impedance source—namely, the primary side impulse generator. The impulse T1p and the impulse T1n are, due to their identical short durations and the identical magnitudes of their amplitudes (i.e., the same voltage time surfaces), transferred without distortion to the secondary side of the transformer Ü.

Upon the inputting of a positive voltage impulse U1p, the diode D1 is driven in the forward or pass direction so that a positive voltage at the gate terminal of the second field effect transistor F2 is available relative to the source terminal S of the second field effect transistor F2. In this manner, the field effect transistor F2 is activated and the drain-source extent of the second field effect transistor F2 is of low resistance or low impedance. Thereafter, a positive impulse with a voltage height U3p=U1p−UD1−UDS2 is at the power transistor LT. In this manner, the power transistor LT is activated. In this connection, the following obtains: UD1 is the voltage drop at the diode D1 in the forward or pass direction and UDS2 is the voltage drop between the drain and the source of the second field effect transistor F2. These two voltage drops are relatively small with respect to U1p, so that the voltage drop U3p is only slightly smaller than U1p. If the voltage U1p drops to zero volts (see FIG. 6), the diode D1 is driven in the blocking direction, whereby the voltage U3p at the gate terminal of the power transistor LT (the voltage at the input capacitor C) remains available at the gate terminal of the power switch LT, since the discharge via the resistor R3 only occurs over a relatively long period. In this manner, the positive voltage U3p remains in effect during the entire duration of T3p (see FIG. 7). In this connection, it is presumed that the time constant provided by the resistor R3 and the capacitor C is more than ten times greater than that of the period T of the signal U3. Only in this manner can the discharge via the resistor R3 be omitted. The resistor R3 ensures that the gate terminal G of the power transistor LT cannot be electrostatically loaded by de-activated electronics.

In connection with the input of a negative voltage impulse U1n, the diode D2 is driven in the forward or pass direction, so that, at the gate terminal of the first field effect transistor F1, a positive voltage is available relative to the source terminal S of the first field effect transistor F1. In this manner, the field effect transistor F1 is activated and the drain-source extent of the first field effect transistor F1 is low resistance or low impedance. Thereafter, a negative impulse is disposed at the power transistor LT having a voltage height U3n=U1n+UD2+UDS1. In this manner, the power transistor LT is de-activated. In this connection, the two voltage drops UD2 and UDS1 are again relatively small with respect to U3n so that the magnitude of U3n is only slightly smaller than the magnitude of U1n. If the voltage U1n drops to zero volts (see FIG. 6), the diode D2 is driven in the blocking direction, whereby the voltage U3n (the voltage at the input capacitor C) remains at the gate of the power transistor LT, since the discharge via the resistor R3 occurs only over a relatively long period. In this manner, the negative voltage U3n remains during the entire duration of T3n (see FIG. 7).

The resistors R1 and R2 are of a special significance: the inductance of the transformer, together with the input capacitor of the field effect transistors, which are disposed between the gate and source terminals, forms a resonant or oscillatory circuit which, without the resistors R1 and R2, would be substantially undamped. A further task of the resistors R1 and R2 is to filter the coupled, high frequency disturbance impulses in a manner such that these impulses do not reach the gate terminals of the field effect transistors F1 and F2. The zener diodes Z1 and Z2 ensure that the input threshold beyond which the field effect transistors F1 and F2 are activated, is raised to the breakdown voltage of the zener diodes. The switching arrangement is thus insensitive to disturbance impulses. These disturbance impulses occur upon the deactivation of the magnetic flow and oscillate around the null or zero point in opposite directions. Further, disturbance impulses arise through the capacitive through-coupled components of the load voltage. Without the heretofore described measures, the disturbance impulses could lead to false activation of the power switch LT.

Figure 4:
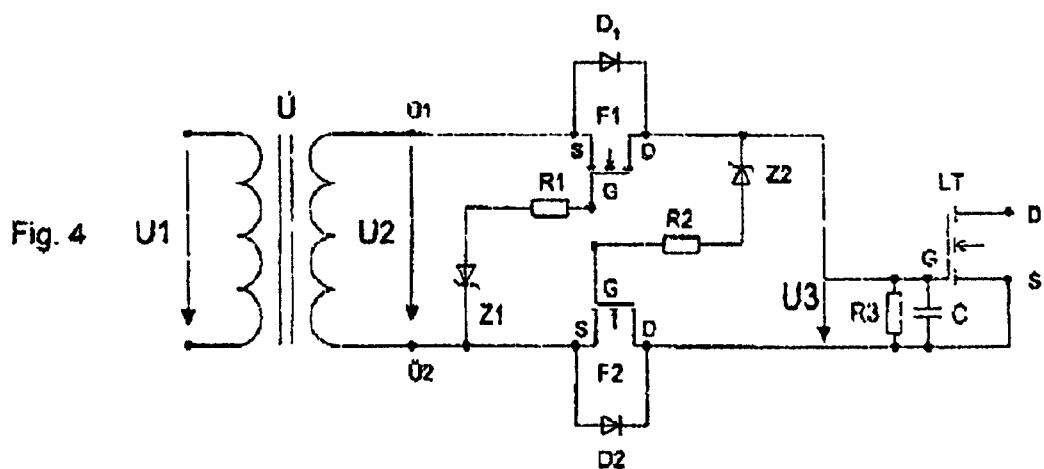
FIG. 4 shows a further embodiment of the switching arrangement of the present invention for controlling a power switch, whereby the gate terminal of the first field effect transistor is connected via a series switch comprising a resistor and a zener diode with the source terminal of the second field effect transistor and the gate terminal of the second field effect transistor is connected via a series switch comprising a resistor and a zener diode with the drain terminal of the first field effect transistor.
Figure 5:
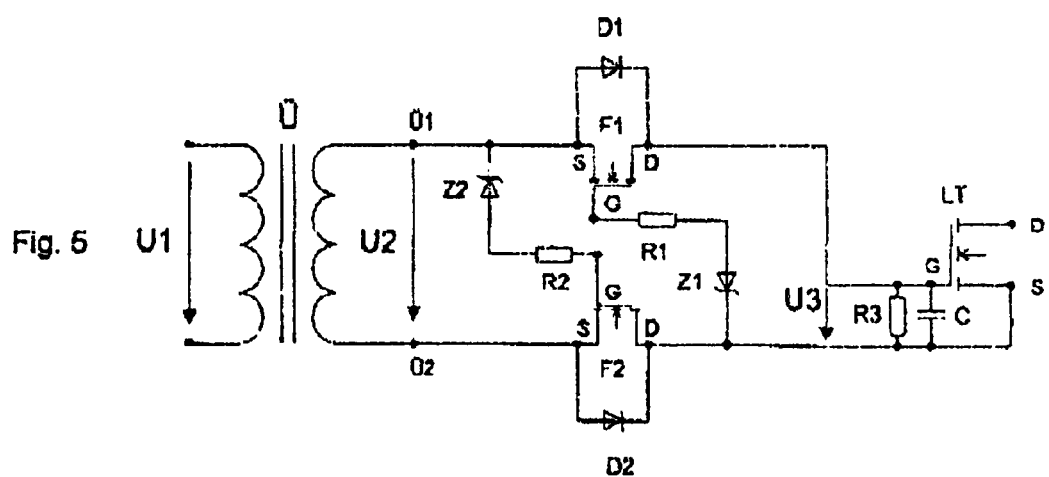
FIG. 5 shows a further embodiment of the switching arrangement of the present invention for controlling a power switch, whereby the gate terminal of the first field effect transistor is connected via a series switch comprising a resistor and a zener diode with the drain terminal of the second field effect transistor and the gate terminal of the second field effect transistor is connected via a series switch comprising a resistor and a zener diode with the source terminal of the first field effect transistor.

The difference of the embodiment shown in FIG. 3 is that the gate terminals are connected via a series switch comprising a resistor and zener diodes with the source terminals of the respective other field effect transistor. In FIG. 4, the difference in this embodiment of the switching arrangement of the present invention is that only the field effect transistor F1 is connected via a series switch comprising a resistor and a zener diode with a source terminal of the second field effect transistor F2 and, in the embodiment shown in FIG. 5, only the second field effect transistor F2 is connected via a series switch comprising a resistor and a zener diode with the source terminal of the first field effect transistor F1. If a switching arrangement is used in which one or both of the gate terminals are connected with the source terminal of the respective other field effect transistor, then, in each instance, both components (the zener diode and the resistor) in the intermediary circuit leading to the source terminal must be intermediately activated. In this event, the forward or through voltage of the free running diode (D1, D2) does not participate in the activation and/or de-activation circuit and cannot, therefore, increase the input threshold.

The switching arrangement is suitable for potential free control of load-controlled power switches, especially, MOS-field effect transistors or IGB-transistors. The signal source for the impulse on the primary side of the transformer Ü is purposely chosen to be very low resistance or very low impedance, whereby a rapid activation of the power switch LT is made possible. If the duration of one of the impulses T3p or T3n were to be configured to be smaller than the period of the corresponding impulses T1p or T1n, respectively, then the switch component on the primary side of the transformer Ü must be configured to limit the period or duration of the impulse T1p or T1n, respectively, to that of the impulse T3p or T3n, respectively. The switching arrangement can be deployed in a multiple option manner in combination circuit components and inverters for controlling power switches.

The features recited in claim 16 are provided by a switching arrangement having opposed winding senses on the primary and secondary sides of the transformer. The impulses on the winding outputs Ü1, Ü2 as well as the impulses T3n, T3p at the power transistor LT, have an opposite voltage direction.

By the deployment of the inventive switching arrangement for controlling a load-controlled power switch, significant advantages are realized relative to the heretofore conventional practice: plus and minus voltages are insulated in a galvanic manner during their transfer so that a secure activation and deactivation of the power transistor is ensured. In this manner, the amplitude in the positive and negative directions remains constant independent of the duty cycle. The galvanically insulated transfer permits the control of a power transistor whose potential is substantially higher than the potential of the control electronics. The switching speed of the power transistor is determined or delimited by the output resistance of the impulse source on the primary side of the transformer and can thus be optimally adjusted or set. The integrity of the insulation between the control electronic and the power circuit can be ensured to a very high degree by corresponding configuration of the transformer. A further advantage of this switching arrangement is that the size of the components of the transformer are relatively small, which results from the short impulse duration (T1p and T1n) of the impulse to be transferred, as a consequence of which only a reduced winding count is needed to produce the impulse.

The specification incorporates by reference the disclosure of German priority documents 199 05 500.9 of 10 Feb. 1999, 199 63 330.4 of 27 Dec. 1999 and PCT/DE00/00368 of 7 Feb. 2000.

The present invention is, of course, in no way restricted to the specific disclosure of the specification and drawings, but also encompasses any modifications within the scope of the appended claims.

What we claim is:

1. A switching arrangement for controlling load-controlled power switches via a transformer which generates positive and negative voltage impulses, comprising:

a transformer for generating positive and negative impulses, the transformer having a primary and a secondary side, the secondary side having discharge circuits and an input for inputting therein voltage impulses in positive and negative directions and having short durations, two field effect transistors each having a source terminal and a drain terminal, the field effect transistors being connected to the discharge circuits at the secondary side of the transformer and being operable to convert the inputted voltage impulses into voltage impulses in positive and negative directions for controlling the power switch, the impulse duration of the voltage impulses being extended to the beginning of the next input impulses with reversed voltage directions, the source terminal of the first field effect transistor being connected with a discharge circuit and the source terminal of the second field effect transistor being connected with a different discharge circuit, the drain terminal of the first field effect transistor being connected with the gate terminal of the power switch and the drain terminal of the second field effect transistor being connected with a further terminal of the power switch and the gate terminal of the first field effect transistor being connected via a first resistor with the drain terminal of the second field effect transistor and the gate terminal of the second field effect transistor being connected via a second resistor with the drain terminal of the first field effect transistor.

2. A switching arrangement according to 1, a respective zener diode is connected in series with each of the first and second resistors.

3. A switching arrangement for controlling load-controlled power switches via a transformer which generates positive and negative voltage impulses, comprising:

a transformer for generating positive and negative impulses, the transformer having a primary and a secondary side, the secondary side having discharge circuits and an input for inputting therein voltage impulses in positive and negative directions and having short durations, two field effect transistors each having a source terminal and a drain terminal, the field effect transistors being connected to the discharge circuits at the secondary side of the transformer and being operable to convert the inputted voltage impulses into voltage impulses in positive and negative directions for controlling the power switch, the impulse duration of the voltage impulses being extended to the beginning of the next input impulses with reversed voltage directions, the source terminal of the first field effect transistor being connected with a discharge circuit and the source terminal of the second field effect transistor being connected with a different discharge circuit, the drain terminal of the first field effect transistor being connected with the gate terminal of the power switch and the drain terminal of the second field effect transistor being connected with a further terminal of the power switch, the gate terminal of the first field effect transistor being connected via a series switch having a first resistor and a first zener diode with the source terminal of the second field effect transistor and the gate terminal of the second field effect transistor being connected via a series switch having a second resistor and a second zener diode with the source terminal of the first field effect transistor.

4. A switching arrangement for controlling load-controlled power switches via a transformer which generates positive and negative voltage impulses, comprising:

a transformer for generating positive and negative impulses, the transformer having a primary and a secondary side, the secondary side having discharge circuits and an input for inputting therein voltage impulses in positive and negative directions and having short durations, two field effect transistors each having a source terminal and a drain terminal, the field effect transistors being connected to the discharge circuits at the secondary side of the transformer and being operable to convert the inputted voltage impulses into voltage impulses in positive and negative directions for controlling the power switch, the impulse duration of the voltage impulses being extended to the beginning of the next input impulses with reversed voltage directions, the source terminal of the first field effect transistor being connected with a discharge circuit and the source terminal of the second field effect transistor being connected with a different discharge circuit, the drain terminal of the first field effect transistor being connected with the gate terminal of the power switch and the drain terminal of the second field effect transistor being connected with a further terminal of the power switch and the gate terminal of the first field effect transistor being connected via a series switch having a first resistor and a first zener diode with the source terminal of the second field effect transistor and the gate terminal of the second field effect transistor being connected via a second resistor with the drain terminal of the first field effect transistor.

5. A switching arrangement according to claim 4, wherein a second zener diode is connected in series with the second resistor.

6. A switching arrangement for controlling load-controlled power switches via a transformer which generates positive and negative voltage impulses, comprising:

a transformer for generating positive and negative impulses, the transformer having a primary and a secondary side, the secondary side having discharge circuits and an input for inputting therein voltage impulses in positive and negative directions and having short durations, two field effect transistors each having a source terminal and a drain terminal, the field effect transistors being connected to the discharge circuits at the secondary side of the transformer and being operable to convert the inputted voltage impulses into voltage impulses in positive and negative directions for controlling the power switch, the impulse duration of the voltage impulses being extended to the beginning of the next input impulses with reversed voltage directions, the source terminal of the first field effect transistor being connected with a discharge circuit and the source terminal of the second field effect transistor being connected with a different discharge circuit, the drain terminal of the first field effect transistor being connected with the gate terminal of the power switch and the drain terminal of the second field effect transistor being connected with a further terminal of the power switch and the gate terminal of the first field effect transistor being connected via a first resistor with the drain terminal of the second field effect transistor and the gate terminal of the second field effect transistor being connected via a series switch having a second resistor and a second zener diode with the source terminal of the first field effect transistor.

7. A switching arrangement according to claim 6, wherein a first zener diode is connected in series with the first resistor.

8. A switching arrangement according to claim 1, wherein a third resistor is connected between the gate terminal and a further terminal of the power switch.

9. A switching arrangement according to claim 1, wherein a MOS-FET (metal oxide semiconductor field effect transistor) or an IGBT (insulated gate bipolar transistor) is used as the power switch.

10. A switching arrangement according to claim 1, wherein the duration of the voltage impulse inputted into the input of the transformer does not exceed five $\mu S$ and is less than or equal to the duration of the activation impulse and less than or equal to the de-activation impulse of the power switch.

11. A switching arrangement according to claim 1, wherein a respective diode is disposed between each of the field effect transistors between the source terminal and the drain terminal thereof.

12. A switching arrangement according to claim 1, wherein an input capacitor is disposed in the power switch between the gate terminal and a further terminal.

13. A switching arrangement according to claim 1, wherein the two field effect transistors effect a transformation of the two input impulses into respective longer impulses of which one effects the activation of power switch and the maintenance of the power switch in its activated condition and the other effects the de-activation of the power switch and maintenance of the power switch in its de-activated condition.

14. A switching arrangement according to 13, wherein the duration of the period of the impulse inputted into the input of the transformer corresponds to the durations of the periods of the impulses which effect the control of the power switch.

15. A switching arrangement according to claim 1, wherein the durations of the periods of the impulse at the power switch can have a predetermined relationship with one another (duty cycle).

16. A switching arrangement according to claim 1, wherein the use of a transformer with oppositely sensed windings of the primary and secondary sides thereof determines the voltage direction of the impulse at the power switch.

* * * * *